(12) United States Patent
Albrecht et al.

(10) Patent No.: US 6,262,875 B1
(45) Date of Patent: Jul. 17, 2001

(54) IGNITION/FIRING ELEMENT WITH AN IGNITION BRIDGE ARRANGED ON A CHIP

(75) Inventors: Uwe Albrecht, Nurnberg; Uwe Brede; Anton Bretfeld, both of Furth; Heinz-Peter Cornelius, Wilhermsdorf; Josef Kraft, Berg, all of (DE)

(73) Assignee: Dynamit Nobel GmbH Explosivstoff-und Systemtechnik, Troisdorf (DE)

( * ) Notice: Subject to any disclaimer, the term of this patent is extended or adjusted under 35 U.S.C. 154(b) by 0 days.

(21) Appl. No.: 09/254,661
(22) PCT Filed: Sep. 11, 1997
(86) PCT No.: PCT/EP97/04976
§ 371 Date: Dec. 2, 1999
§ 102(e) Date: Dec. 2, 1999
(87) PCT Pub. No.: WO98/11400
PCT Pub. Date: Mar. 19, 1998

(30) Foreign Application Priority Data

Sep. 14, 1996 (DE) .............................................. 196 37 587

(51) Int. Cl.[7] .............................. F23Q 13/00; F42C 19/12
(52) U.S. Cl. ............................................................ 361/247
(58) Field of Search ............. 361/247; 102/202.1–202.4, 102/202.5, 202.7–202.9

(56) References Cited

U.S. PATENT DOCUMENTS

| | | | | |
|---|---|---|---|---|
| 5,085,146 | * | 2/1992 | Baginski | 102/202.5 |
| 5,431,101 | * | 7/1995 | Arrell, Jr. et al. | 102/202.1 |
| 5,454,320 | * | 10/1995 | Hilden et al. | 102/202.7 |

FOREIGN PATENT DOCUMENTS

| 3883266 | 8/1988 | (DE) | F42B/3/16 |
|---|---|---|---|

* cited by examiner

*Primary Examiner*—Ronald W. Leja
(74) *Attorney, Agent, or Firm*—Antonelli, Terry, Stout & Kraus, LLP

(57) ABSTRACT

An igniting/firing element includes a casing (1) receiving electrical junction lines connected to an igniting jumper (3) on a chip (2) provided with at least one igniting unit (4a, 4b). In order to allow for the element to be universally used and to avoid uncontrolled discharge, it is suggested that the junction lines be designed in the form of pins, which are led to the casing (1) through a glass seal, and that the casing bottom (1) be a metal body (7) in which bores (8) are provided for said glass seals (6) to pass through, and that the metal body be positive-fit to the plastic body (9) covering the peripheral wall of the casing (1) and wrapping the pin tops (5) emerging from the glass seal (6).

9 Claims, 4 Drawing Sheets

IGNITION/FIRING ELEMENT WITH AN IGNITION BRIDGE ARRANGED ON A CHIP

BACKGROUND OF THE INVENTION

The invention concerns an ignition/firing element with a housing into which pass electrical connecting leads that are connected to an ignition bridge arranged on a chip, on which at least one ignition charge is placed.

An igniter for triggering detonators is disclosed in DE 38 83 266 T2. The igniter consists of an electrically operated igniter head or fuse head, a power source that is connected to the igniter head via a switching device, and an electronic unit. The electronic unit has at least one chip made from a semiconductor material and provided with a microcircuit. The chip supports an ignition head or an ignition bridge on its surface. The firing charge is placed directly onto the ignition bridge.

SUMMARY OF THE INVENTION

The object of the invention is to create an ignition/firing element, which due to its compact form of construction can be universally used and in which uncontrolled gas release on ignition of the ignition/firing element is prevented.

This object is achieved by the invention in that the connecting leads are pins that are led into the housing through a glass bushing, a metal body forms the base of the housing and this metal body has passages into which the glass bushings are inserted, and the metal body is joined in a positive locking manner to a plastic body which covers the peripheral wall of the housing and which envelops the ends of the pins projecting from the glass bushing.

The mode of operation of the ignition/firing element is as follows: when an electrical voltage is applied to both pins this causes a current to flow through the ignition/firing element and the electrical energy is converted into thermal energy in the ignition bridge; the ignition bridge heats up. The firing charge placed on the ignition bridge is thereby triggered and the pressed base of the housing is ruptured by the gas pressure resulting from the conversion of the ignition charge or firing charges, respectively. The hot gases and particles can escape through this opening in order to ignite a following charge.

For permanent, stable coupling of the plastic body to the metal body, advantageously, the metal body has a reduced diameter with a peripheral groove at its end facing the ignition charge. At least two cut-outs are incorporated in this slot in the passages above the glass bushings. By injecting or integrally moulding the plastic body, this envelops the area of the reduced diameter of the metal body and penetrates the passages via the groove and the cut-outs and completely fills these passages above the glass bushings. An optimum connection is thus obtained.

Usefully, the housing is constructed in the form of a sleeve, the metal body forming the lower base plate. Advantageously, the housing encloses the plastic body and the metal body and is connected at the lower end of the metal body via a flange and a sealing composition.

In an advantageous development the chip rests on the metal body.

According to the invention, the chip has on its front side a conductive surface onto which is deposited at least one resistive track that is isolated from the conductive surface by laser cutting, so as to produce at least one ignition bridge having the necessary resistance values. The effect of laser cutting is to remove specific areas of the conductive surface.

To support the ignition and firing process it is advantageous to use an ignition bridge which initiates an exothermic reaction during ignition. For example, magnesium or zirconium or an alloy thereof is suitable for this purpose. The advantage of this is that the ignition charge no longer has to be permanently mechanically pressed onto the ignition bridge, since the ignition bridge itself produces an exothermic reaction after triggering.

One possibility for preventing unintentional triggering by noise pulses, high-frequency radiation, etc., is to connect a capacitor in parallel with the ignition circuit. Advantageously, the rear side of the chip is therefore metallized so that, in conjunction with the conductive surface on the front side, the chip forms a capacitor and this capacitor is connected in parallel with the ignition circuit. Other electronic components, such as resistors, coils, capacitors etc., can of course be additionally arranged on the chip.

BRIEF DESCRIPTION OF THE DRAWINGS

Further features of the invention emerge from the figures which are described below, and in which.

DETAILED DESCRIPTION OF THE PREFERRED EMBODIMENTS

Figure 1:
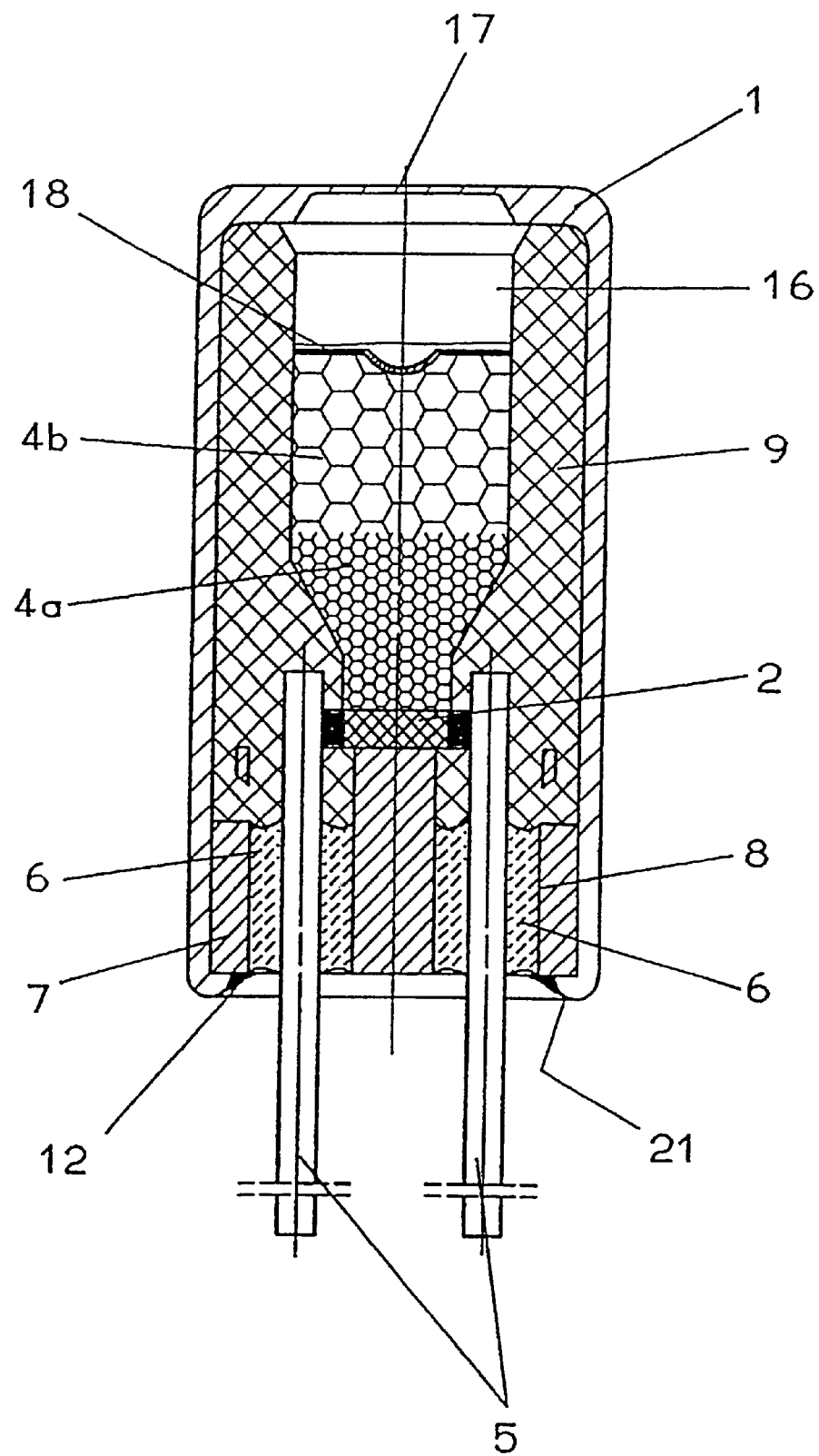
FIG. 1 shows a section through an ignition/firing element according to the invention.

FIG. 1 shows a sectional view of the complete ignition/firing element. A metal body 7, through which pass pins 5 acting as electrical supply leads, is arranged as the base plate of a sleeve-type housing 1. For this purpose the metal body 7 has passages 8 into each of which is inserted a glass bushing 6 through which the pins 5 are led. The glass bushing 6 insulates the pins 5 from the metal body 7. The ignition bridge of the ignition/firing element is arranged on a chip 2 that rests on the metal body 7. The chip 2 is described in more detail later. The pins 5 are led up to the chip 2 and actually project slightly beyond the chip 2. The pins 5 are electrically connected to the chip 2 by soldering or bonding. A plastic body 9 is joined in a positive locking manner to the metal body 7 and provides completely the peripheral wall of the housing 1. A recess 16 in the shape of a neck of a bottle, at the lower end of which the chip 2 is located, is arranged inside the plastic body 9. An ignition charge 4a and above it a second ignition charge 4b is placed on the chip 2 or on the ignition bridge. The upper side of the housing 1 has a flattened part 17 in the form of a predetermined rupture point. The housing 1 is joined to the metal body 7 by a flange 21 and a sealing composition 12.

The ignition/firing element or firing cap is a compact unit which is resistant to mechanical, thermal and climatic influences. The ignition/firing element is therefore extremely reliable. Due to the metallic casing, the sleeve-type housing 1 and the subsequent application of the sealing composition 12, as well as the sealed glass bushing 6, the ignition/firing element is totally sealed.

In order to increase the mechanical resistance to gas release, the printing area or ignition charge 4 can it necessary be additionally protected by a cover 18.

The ignition charges 4a, 4b can be incorporated both in a dry and in a moist state—with subsequent drying. Which type is chosen depends on the type of charge and the associated economically practical mounting.

The types and quantities of the charge depend on the respective application and can be varied accordingly. It is also perfectly possible to fill the ignition/firing element with only one type of charge. This has the advantage that the handling costs are lower than when two types of charge 4a, 4b are fitted.

An important feature is the positive-locking connection between the plastic body 9 and the metal part 7. FIGS. 2a, b showing the metal body 7 with pins 5 inserted in the glass bushing 6 illustrate this particularly well. The pins 5 are electrically insulated from the metal body 7 by the glass bushing 6 or the glass inserts, and are thus sealed against moisture during storage and prevent the gases escaping when the ignition/firing element is ignited.

Figure 2B:
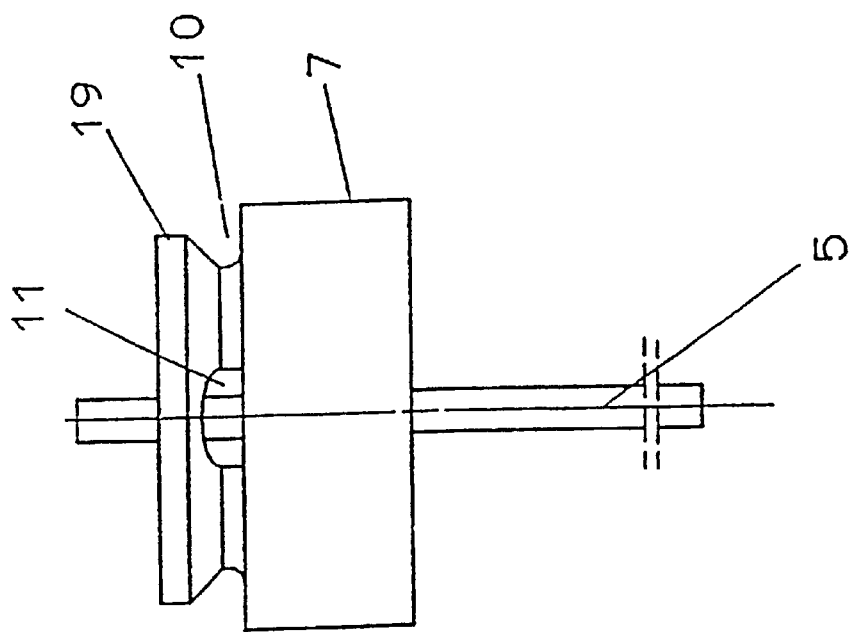
FIG. 2a shows a sectional view of a metal body with inserted pins and FIG. 2b shows a view of FIG. 2a rotated through 90°.
Figure 2A:
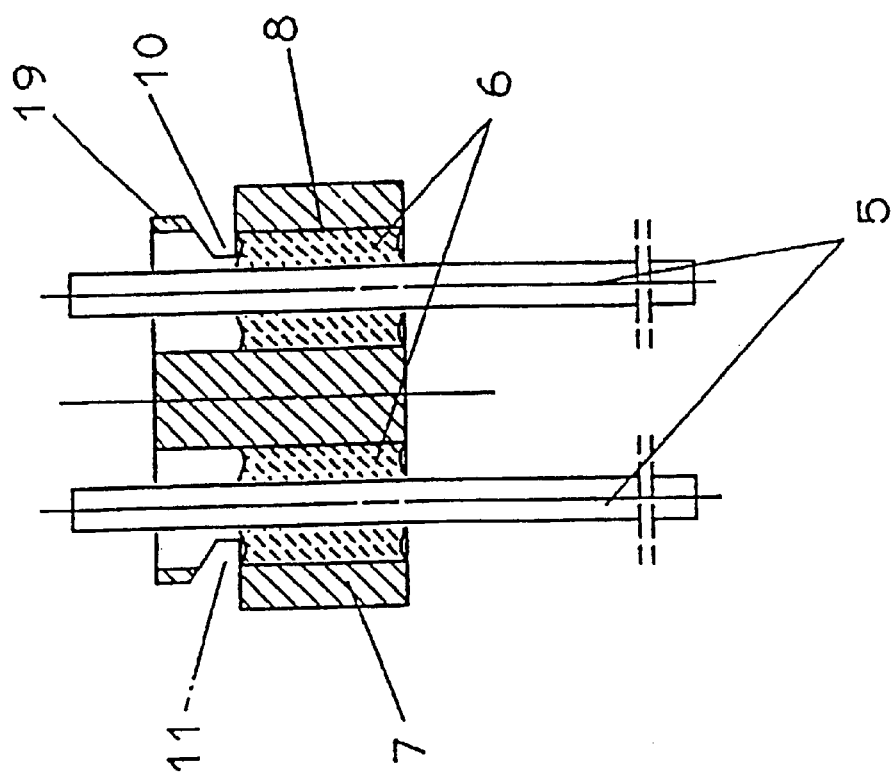

For positive-locking coupling, the metal body 7 has a reduced diameter with a peripheral groove 10 at its end facing the ignition charge (not shown in FIG. 2). At least two cut-outs 11 are incorporated in the passages 8 in this groove 10, above the glass bushings 6. This allows the plastic of the plastic body to flow along the tapered wall 19 into the slot 10 and from there via the cut-outs 11 into the passages 8 and to fill the latter. FIG. 1 shows the result, that is to say an extremely strong and permanent, and thus leakproof, coupling between the plastic body 9 and the metal body 7.

The upper side of the metal part 7 and the pins 5 should be designed so that a permanent electrical connection can be made to the chip 2. This is, for example, a tin coating on the pins 5 if the chip 2 is connected by soldering, or a gold coating on the pins 5 if the chip connection is made by bonding.

Figure 3:
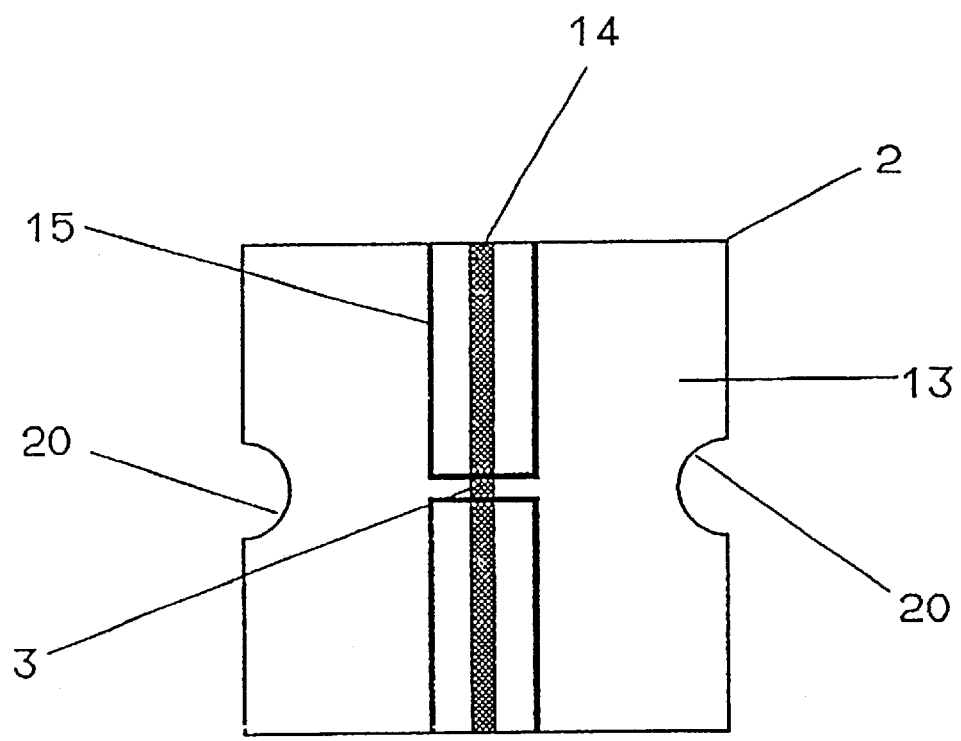
FIG. 3 shows a plan view of a chip.

FIG. 3 shows a plan view of the chip 2. The surface of the chip 2 is a gold coating 13. The semicircular bays 20 are used to receive the pins 5, which are bonded to the gold coating 13. A resistive track 14 is applied across the surface. This resistive track 14 is isolated from the gold coating 13 by laser cutting 15, so that only one ignition bridge 3 remains.

The geometry of the ignition bridge can be varied by the laser cutting 15 and a wide range produced in an economical manner. This is necessary in practice to enable the required various electrical operating data to be obtained. Further parameters for ensuring serviceability with the required performance data are the coating thickness and the materials, which are preferably applied by means of the sputtering method.

In a special embodiment, the resistive track 14, and thus the ignition bridge 3, consist of a material with an exothermic reaction, for example magnesium or zirconium or an alloy of these materials.

One possibility for preventing unintentional triggering by noise pulses, high-frequency radiation, etc., is to construct the chip 2 as a capacitor which is connected in parallel with the ignition circuit. This can be achieved by suitably metallizing the rear side of the chip 2.

Figure 4A:
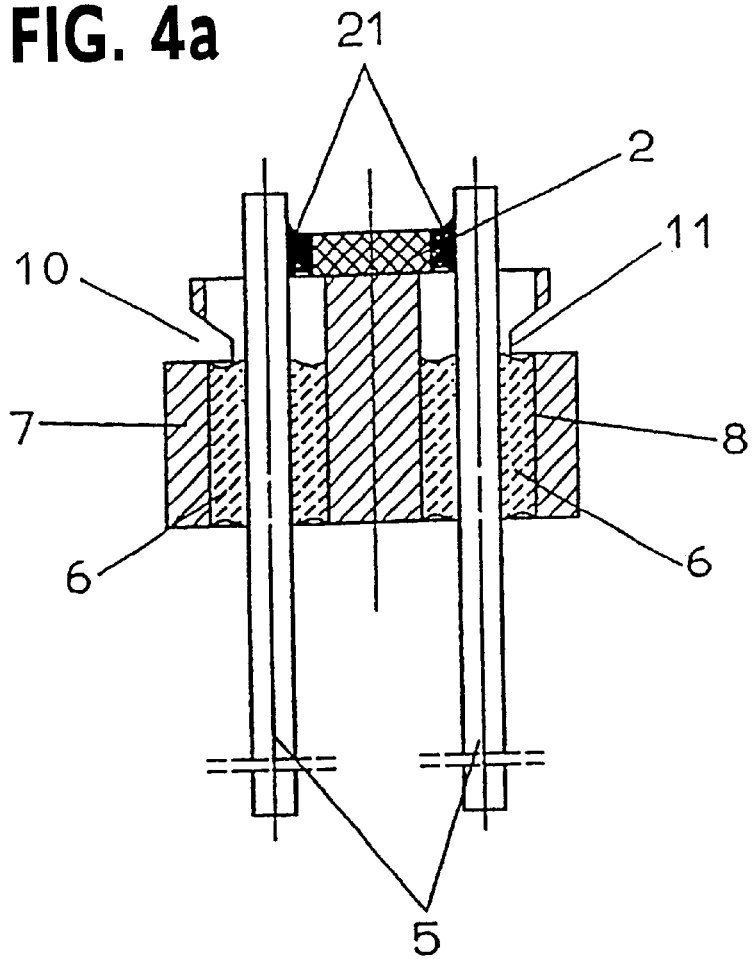
FIG. 4a shows a sectional view of a metal body with mounted chip and FIG. 4b shows a top plan view thereof.
Figure 4B:
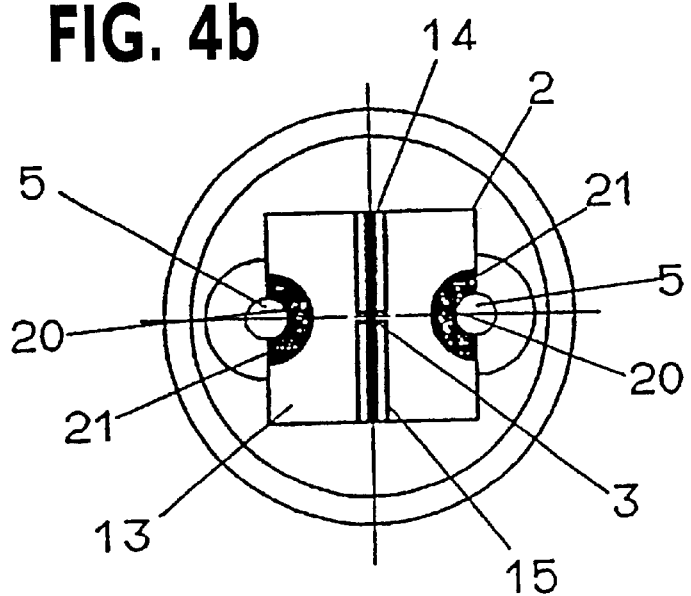

FIG. 4 shows a sectional view (FIG. 4a) and a top plan view (FIG. 4b) of the assembly comprising the metal body 7 with inserted pins 5 and connected chip 2.

In this arrangement the chip 2 is electrically connected to the pins 5 by soldering 21. As can be seen from the figure, the chip 2 lies flat on the surface of the metal body 7 and has 2 semicircular passages 20 which are filled by the pins 5. Both the mounting of the two components during assembly and the subsequent secure electrical connection can therefore be achieved in this manner. The connection can be made by soldering, a bonded joint or another suitable method.

What is claimed is:

1. Ignition/firing element with a housing into which pass electrical connecting leads that are connected to an ignition bridge arranged on a chip, on which at least one ignition charge is placed, characterised in that the connecting leads are pins that are lead into the housing through a glass bushing, a metal body forms the base of the housing and this metal body has passages into which the glass bushings are inserted, and the metal body is joined in a positive locking manner to a plastic body which forms a peripheral wall of the housing and which envelops and contacts the ends of the pins projecting from the glass bushing within the housing.

2. Ignition/firing element according to claim 1, characterised in that at its end facing the ignition charge the metal body has a reduced diameter with a peripheral groove and in this groove at least two cut-outs are incorporated in the passages above the glass bushings.

3. Ignition/firing element according to claim 1, characterised in that the housing comprises the plastic body and the metal body, and the plastic body is joined to said metal body at the lower end of the latter via a flange and a sealing composition.

4. Ignition/firing element according to claim 1, characterised in that the chip rests on the metal body.

5. Ignition/firing element according to claim 1, characterised in that the chip has a conductive surface onto which is deposited at least one resistive track that is isolated from the conductive surface by laser cutting, so as to produce at least one ignition bridge having the necessary resistance values.

6. Ignition/firing element according to claim 5, characterised in that the resistive track and thus the ignition bridge consists of a material having an exothermic reaction.

7. Ignition/firing element according to claim 5, characterised in that the rear of the chip is metallized and, in conjunction with the conductive surface on the front side, the chip thereby forms a capacitor, and this capacitor is connected in parallel with the ignition circuit.

8. Ignition/firing element according to claim 6, characterised in that the material having an exothermic reaction comprises magnesium or zirconium.

9. Ignition/firing element with a housing into which pass electrical connecting leads that are connected to an ignition bridge arranged on a chip, on which at least one ignition charge is placed, characterised in that the connecting leads are pins that are lead into the housing through a glass bushing, a metal body forms the base of the housing and this metal body has passages into which the glass bushings are inserted, the metal body is joined in a positive locking manner to a plastic body which forms a peripheral wall of the housing and which envelops and contacts the ends of the pins projecting from the glass bushing within the housing, and the metal body has a reduced diameter at its end facing the ignition charge with a peripheral groove, and in this groove at least two cut-outs are incorporated above the glass bushings, the plastic of the plastic body filling the cut-outs.

* * * * *